(12) United States Patent
Kobayashi

(10) Patent No.: US 10,820,406 B2
(45) Date of Patent: Oct. 27, 2020

(54) CIRCUIT STRUCTURE AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES LTD., Osaka-shi, Osaka (JP)

(72) Inventor: Takehito Kobayashi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

(*) Notice: Subject to any disclaimer, the term of this patent is extended or adjusted under 35 U.S.C. 154(b) by 247 days.

(21) Appl. No.: 15/754,323

(22) PCT Filed: Aug. 10, 2016

(86) PCT No.: PCT/JP2016/073564
§ 371 (c)(1),
(2) Date: Feb. 22, 2018

(87) PCT Pub. No.: WO2017/038419
PCT Pub. Date: Mar. 9, 2017

(65) Prior Publication Data
US 2019/0014654 A1    Jan. 10, 2019

(30) Foreign Application Priority Data
Aug. 28, 2015  (JP) ................................. 2015-168956

(51) Int. Cl.
*H05K 1/00*     (2006.01)
*H05K 1/02*     (2006.01)
(Continued)

(52) U.S. Cl.
CPC ............. *H05K 1/0204* (2013.01); *H02G 3/16* (2013.01); *H05K 3/0061* (2013.01);
(Continued)

(58) Field of Classification Search
CPC .. H05K 1/0204; H05K 1/0203; H05K 1/0263; H05K 1/181; H05K 7/20509;
(Continued)

(56) References Cited

U.S. PATENT DOCUMENTS

2004/0223304 A1* 11/2004 Kobayashi .......... B60R 16/0238
361/715

FOREIGN PATENT DOCUMENTS

| JP | 2005-228799 A | 8/2005 |
| JP | 2007306672 A | * 11/2007 |
| JP | 2015-119607 A | 6/2015 |

OTHER PUBLICATIONS

Search Report for PCT/JP2016/073564, dated Sep. 6, 2016.

* cited by examiner

*Primary Examiner* — Anatoly Vortman
*Assistant Examiner* — Zhengfu J Feng
(74) *Attorney, Agent, or Firm* — Honigman LLP

(57) ABSTRACT

A circuit structure includes a circuit board having a connection opening. An electronic component is mounted on a top surface side of the circuit board, and a plurality of bus bars are disposed on a bottom surface side thereof, the electronic component includes a plurality of connection terminals, and a connection terminal of the plurality of connection terminals is connected to a bus bar on the bottom surface side of the circuit board via the connection opening. The circuit structure includes a heat dissipation member provided on a side of the plurality of bus bars opposite to a surface on which the electronic component is connected, an insulating heat-transfer material having insulating properties and heat (Continued)

transferring properties, and a restricting member is provided between the plurality of bus bars and the heat dissipation member, and restricts movement of the insulating heat-transfer material caused by an increase in temperature.

10 Claims, 6 Drawing Sheets

(51) Int. Cl.
    *H02G 3/16*     (2006.01)
    *H05K 7/20*     (2006.01)
    *H05K 3/00*     (2006.01)
    *H05K 7/14*     (2006.01)
    *H05K 1/18*     (2006.01)

(52) U.S. Cl.
    CPC ....... *H05K 7/1427* (2013.01); *H05K 7/20509* (2013.01); *H05K 1/0203* (2013.01); *H05K 1/0263* (2013.01); *H05K 1/181* (2013.01); *H05K 2201/066* (2013.01); *H05K 2201/10272* (2013.01); *H05K 2201/2018* (2013.01)

(58) Field of Classification Search
    CPC ............... H05K 7/1427; H05K 3/0061; H05K 2201/066; H05K 2201/10272; H05K 2201/2018; H02G 3/16
    USPC ........................................................ 361/709
    See application file for complete search history.

CIRCUIT STRUCTURE AND ELECTRICAL JUNCTION BOX

CROSS-REFERENCE TO RELATED APPLICATIONS

This application is the U.S. national stage of PCT/JP2016/073564 filed Aug. 10, 2016, which claims priority of Japanese Patent Application No. JP 2015-168956 filed Aug. 28, 2015.

TECHNICAL FIELD

The technique disclosed herein relates to a circuit structure and an electrical junction box including the circuit structure, and more particularly to a technique for dissipating heat generated by an electronic component included in the circuit structure.

BACKGROUND

As a conventional technique for dissipating heat generated by an electronic component such as a vehicle-mounted electric/electronic component included in a circuit structure, the technique disclosed in JP 2013-99071A is known, for example. JP 2013-99071A discloses a technique for transferring heat generated by an electronic component to a heat sink (heat dissipation member) via a bus bar and an insulating heat-transfer material, and dissipating the heat from the heat sink. In this case, a heat-curable adhesive has hitherto been used as the insulating heat-transfer material. To omit steps required for heat curing that includes increasing the temperature for heating and time for cooling, there are cases in which a cold setting adhesive is used in place of the heat-curable adhesive.

However, in the case of using a cold setting adhesive as the insulating heat-transfer material, the cold setting adhesive disposed between the bus bar and the heat dissipation member may escape from directly below the electronic component to the surroundings thereof owing to thermal cycles because the cold setting adhesive generally has a lower degree of hardness than that of a heat-curable adhesive. That is, when the cold setting adhesive softens or expands when the cold setting adhesive is at a high temperature, the cold setting adhesive sandwiched between the bus bar and the heat dissipation member, which are highly rigid, is pushed out from directly below the electronic component to the surroundings thereof. In this case, the amount of cold setting adhesive located directly below an electronic component acting as a heat generating element becomes insufficient when the temperature of the cold setting adhesive decreases. This results in the possibility of the interface between the bus bar and the heat dissipation member being separated, for example. When the interface between the bus bar and the heat dissipation member is separated, the heat transfer from the bus bar to the heat dissipation member decreases, which results in a reduction in the heat dissipation effect provided by the heat dissipation member.

The technique disclosed herein has been completed based on the above-described situation, and the present specification provides a circuit structure that can suppress a reduction in the heat dissipation effect provided by the heat dissipation member included in the circuit structure owing to thermal cycles.

SUMMARY

A circuit structure disclosed herein includes: a circuit board having a connection opening, an electronic component being mounted on a top surface side of the circuit board, a plurality of bus bars being disposed on a bottom surface side thereof, the electronic component including a plurality of connection terminals, and at least one connection terminal of the plurality of connection terminals being connected to a bus bar on the bottom surface side of the circuit board via the connection opening; a heat dissipation member provided on a side of the plurality of bus bars that is opposite to the side on which the electronic component is connected, via an insulating heat-transfer material that has insulating properties and heat transferring properties; and a restricting member that is provided between the plurality of bus bars and the heat dissipation member, and that restricts movement of the insulating heat-transfer material caused by an increase in the temperature of the insulating heat-transfer material.

With this configuration, the restricting member that restricts movement of the insulating heat-transfer material caused by an increase in the temperature of the insulating heat-transfer material is provided between the plurality of bus bars and the heat dissipation member. Accordingly, even if, for example, a cold setting adhesive is used as the insulating heat-transfer material and the cold setting adhesive softens or expands when the temperature of the insulating heat-transfer material increases, escape of the insulating heat-transfer material from below the electronic component to the surroundings thereof between the plurality of bus bars and the heat dissipation member can be restricted by the restricting member. Consequently, the amount of insulating heat-transfer material located directly below the electronic component acting as a heat generating element will not become insufficient when the temperature of the insulating heat-transfer material decreases, and thus heat transfer enabled by the insulating heat-transfer material from the bus bars to the heat dissipation member is maintained. As a result, it is possible to suppress a reduction in the heat dissipation effect of the heat dissipation member included in the circuit structure owing to thermal cycles.

Note that "movement of the insulating heat-transfer material" as used herein also includes expansion, displacement, shifting or the like of the insulating heat-transfer material caused by an increase in the temperature of the insulating heat-transfer material.

In the above-described circuit structure, the restricting member may be constituted by a frame plate that has insulating properties, the frame plate may include: an application opening that is provided corresponding, in plan view, to a position at which the electronic component is disposed, and that serves to allow application of the insulating heat-transfer material to the electronic component; and a frame portion that is formed around the application opening, and that includes a protruding portion that protrudes to the heat dissipation member side, and the heat dissipation member may include a groove in which the protruding portion of the frame portion is embedded.

With this configuration, the restricting member is constituted by a frame plate including an application opening that serves to allow application of the insulating heat-transfer material, and a frame portion including a protruding portion protruding to the heat dissipation member side. In addition, the protruding portion of the frame portion is embedded in the groove of the heat dissipation member. Accordingly, even when, for example, a cold setting adhesive is used as the insulating heat-transfer material, and the cold setting adhesive softens or expands when the temperature of the insulating heat-transfer material increases, escape of the cold setting adhesive applied to the inside of the application opening from directly below the electronic component to the surroundings thereof can be suppressed.

At this time, the restricting member may be configured to further include an insulating sheet that is provided between the plurality of bus bars and the frame plate, and that covers gaps between the plurality of bus bars, the insulating sheet being configured to restrict movement of the insulating heat-transfer material from directly below the electronic component to the gaps.

In this case, movement of the insulating heat-transfer material from directly below the electronic component to the gaps between the plurality of bus bars when the temperature of the insulating heat-transfer material increases can be further restricted by the insulating sheet. This can further suppress a reduction in the heat dissipation effect of the heat dissipation member included in the circuit structure owing to thermal cycles.

In the above-described circuit structure, the restricting member may simply be configured by an insulating sheet that is provided between the plurality of bus bars and the heat dissipation member, and that covers gaps between the plurality of bus bars, the insulating sheet being configured to restrict movement of the insulating heat-transfer material from directly below the electronic component to the gaps.

In this case as well, movement of the insulating heat-transfer material from directly below the electronic component to the gaps between the plurality of bus bars when the temperature of the insulating heat-transfer material increases can be restricted. Consequently, it is possible to suppress a reduction in the heat dissipation effect of the heat dissipation member owing to thermal cycles.

In the above-described circuit structure, the insulating sheet may contain an adhesive.

With this configuration, the insulating sheet can be fixed to the plurality of bus bars. Consequently, it is possible to prevent shifting or the like of the insulating sheet, and the insulating sheet can be stably held between the plurality of bus bars and the heat dissipation member.

In the above-described circuit structure, it is preferable that the insulating heat-transfer material is constituted by a cold setting adhesive.

With this configuration, due to the insulating heat-transfer material being a cold setting adhesive, it is possible to omit the steps required for heat curing that includes increasing the temperature for heating and time for cooling, and further utilize the effect of restricting the insulating heat-transfer material by the restricting member when the temperature of the insulating heat-transfer material increases.

The electrical junction box disclosed herein includes any one of the above-described circuit structures and a case that houses the circuit structure.

Advantageous Effects of Invention

According to the technique disclosed herein, it is possible to suppress a reduction in the heat dissipation effect provided by the heat dissipation member included in the circuit structure owing to thermal cycles.

DETAILED DESCRIPTION OF PREFERRED EMBODIMENTS

An embodiment will be described with reference to FIGS. 1 to 6.

1. Configuration of Electrical Junction Box

Figure 1:
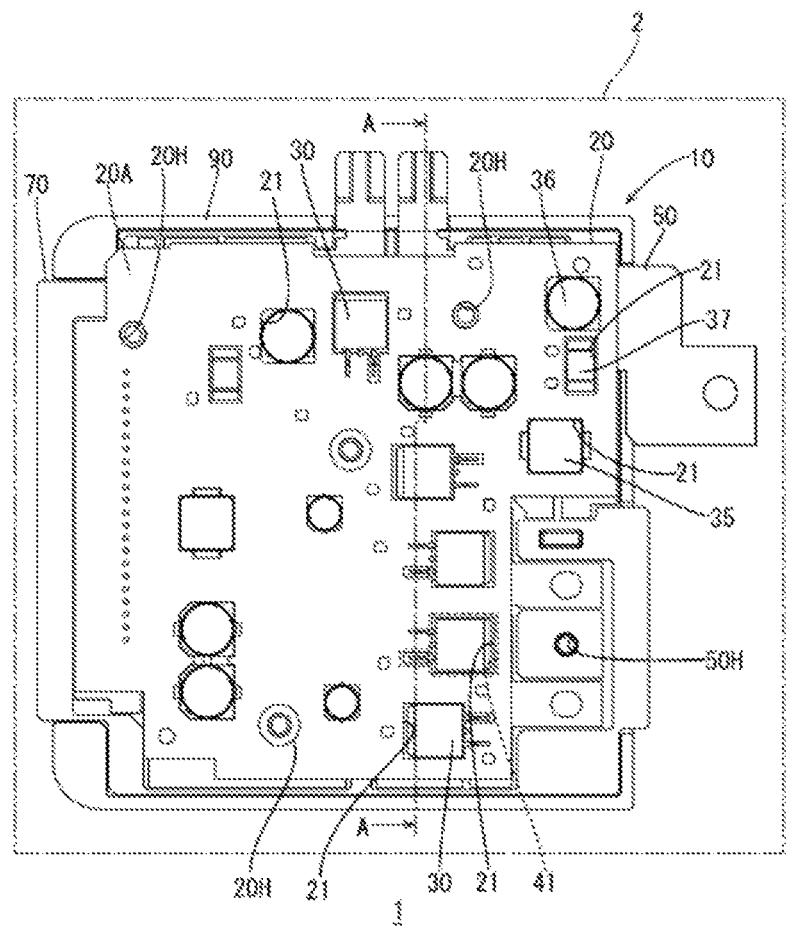
FIG. 1 is a schematic plan view of an electrical junction box according to an embodiment.

As shown in FIG. 1, an electrical junction box 1 according to the present embodiment includes a circuit structure 10 and a synthetic resin case 2 that houses the circuit structure 10. The electrical junction box 1 further includes a metal cover (not shown) that covers the circuit structure 10.

2. Configuration of Circuit Structure

The circuit structure 10 includes a circuit board 20, an N channel MOSFET (hereinafter simply referred to as "MOSFET") 30, an adhesive sheet 40, a plurality of bus bars 50, an insulating sheet 60, a frame plate 70, a heat dissipation plate 90, and so forth. In the present embodiment, the circuit structure 10 is a DC-DC converter that is mounted to a vehicle. Note that the circuit structure 10 is not limited thereto. The MOSFET 30 is an example of the electronic component.

The circuit board 20 has a plurality of connection openings 21 for connecting each of the electronic components such as the MOSFET 30 to a predetermined one of the bus bars 50. As shown in FIG. 1, at least one connection terminal of a plurality of connection terminals of heat-generating electronic components such as the MOSFET 30, a coil 35, a capacitor 36, and a resistor 37 is connected to a corresponding bus bar 50 via a corresponding connection opening 21 using solder, for example.

For example, the MOSFET 30 includes a body portion 31 constituted by a semiconductor and is molded using a synthetic resin, as well as a gate terminal 32, a drain terminal 33, and a source terminal 34 each serving as one of a plurality of connection terminals. The drain terminal 33 and the source terminal 34 are each connected to a corresponding bus bar 50. Note that the gate terminal 32 is connected to wiring (not shown) formed on a top surface 20A of the circuit board 20. That is, the MOSFET 30 is mounted on the top surface side of the circuit board 20. Here, the top surface 20A of the circuit board 20 is the surface on the side indicated by the arrow "UP" in FIG. 2.

Further, two connection terminals of each of the coil 35, the capacitor 36, and the resistor 37 are connected to a corresponding bus bar 50 via a corresponding connection opening 21.

The plurality of bus bars 50 are provided on a bottom surface 20B side of the circuit board 20. Here, the bottom surface 20B of the circuit board 20 is the surface on the side indicated by the arrow "DOWN" in FIG. 2. The plurality of bus bars 50 include, for example, a ground bus bar that has a ground potential and a power supply bus bar that has a power supply potential. The plurality of bus bars 50 are formed, for example, by pressing a metal plate material into a predetermined shape. Each bus bar 50 has a substantially rectangular shape, and is disposed in a predetermined pattern with a gap S between itself and the bus bar 50 adjacent thereto.

Figure 3:
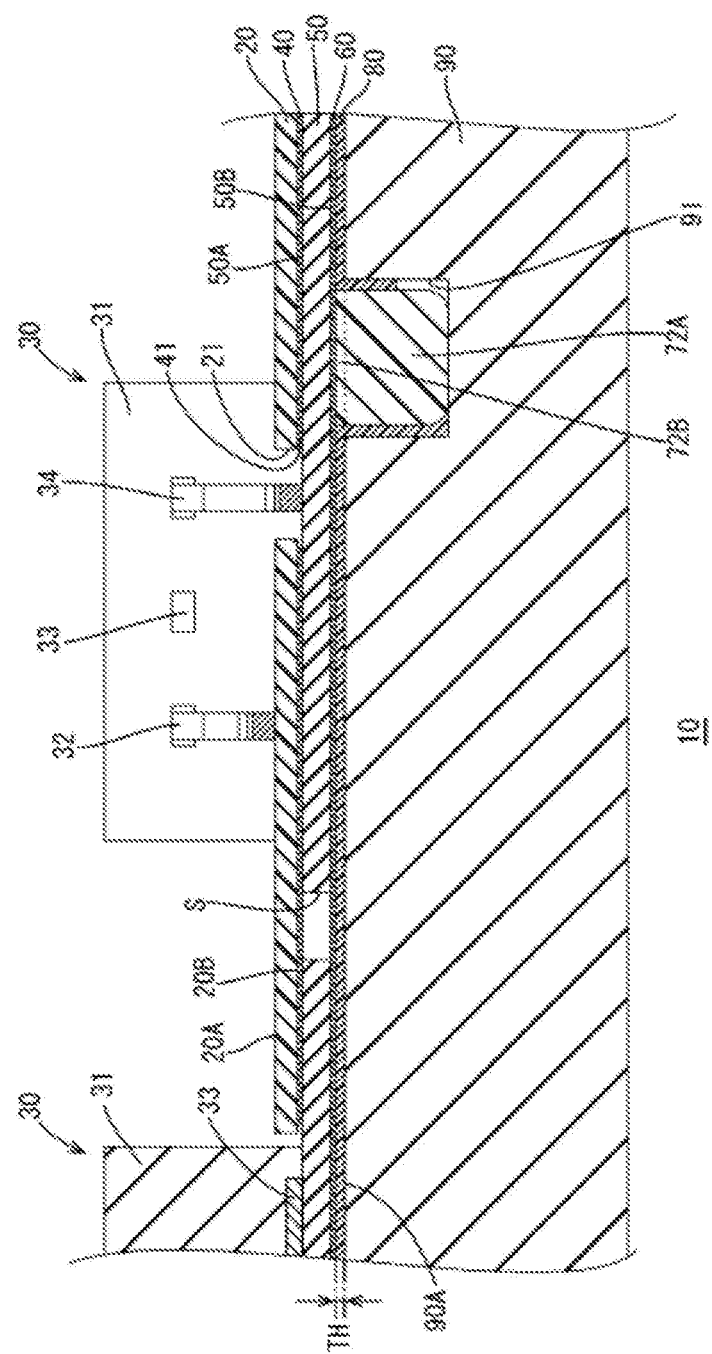
FIG. 3 is a partially enlarged cross-sectional view of FIG. 2.

More specifically, as shown in FIG. 3, the adhesive sheet 40 that bonds the circuit board 20 and the plurality of bus bars 50 to each other is provided between the circuit board 20 and the plurality of bus bars 50. That is, each of the bus bars 50 is bonded to the bottom surface 20B of the circuit board 20 via the adhesive sheet 40.

Note that, as shown in FIGS. 1 and 3, the adhesive sheet 40 has sheet openings 41 for allowing the connection terminals of each of the electronic components to be connected to a predetermined bus bar 50. The planar shape of the adhesive sheet 40 is substantially equal to the planar shape of the circuit board 20. The size of the sheet openings 41 is larger than that of the connection openings 21 of the circuit board 20 (see FIGS. 1 and 3).

As shown in FIG. 3, the insulating sheet 60 is provided between the plurality of bus bars 50 and the frame plate 70. The planar shape of the insulating sheet 60 is substantially equal to the planar shape of the circuit board 20, and the insulating sheet 60 covers the gaps S between the plurality of bus bars 50 (see FIGS. 4 and 5). The insulating sheet 60 covers the gaps S between the plurality of bus bars 50, thereby restricting movement of the insulating heat-transfer material 80 from directly below the MOSFET 30 to the gaps S as the temperature of the insulating heat-transfer material 80 increases. The insulating sheet 60 is an example of the "restricting member".

Figure 2:
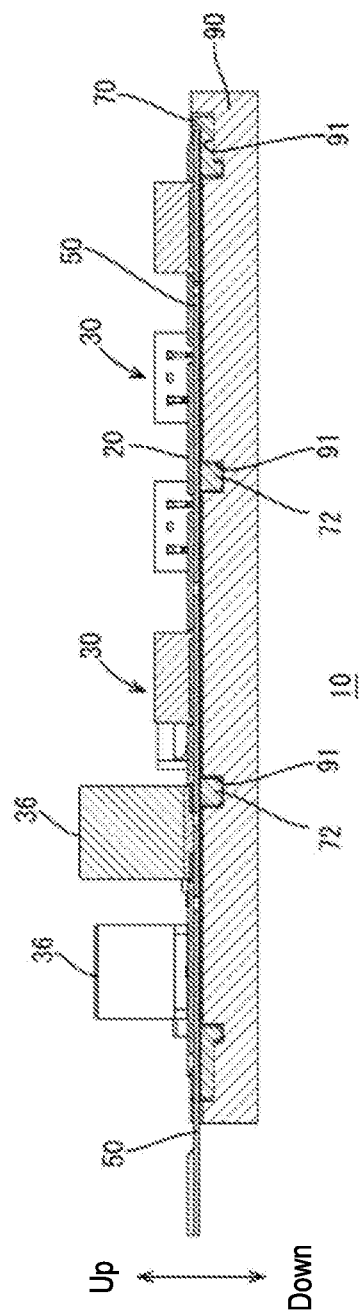
FIG. 2 is a cross-sectional view taken along the line A-A in FIG. 1.

As shown in FIGS. 2 and 3, the frame plate 70 is provided between the plurality of bus bars 50 and the heat dissipation plate 90. More specifically, the frame plate 70 is provided between the insulating sheet 60 and the heat dissipation plate 90, and is fitted to a groove 91 formed in the heat dissipation plate 90.

Figure 4:
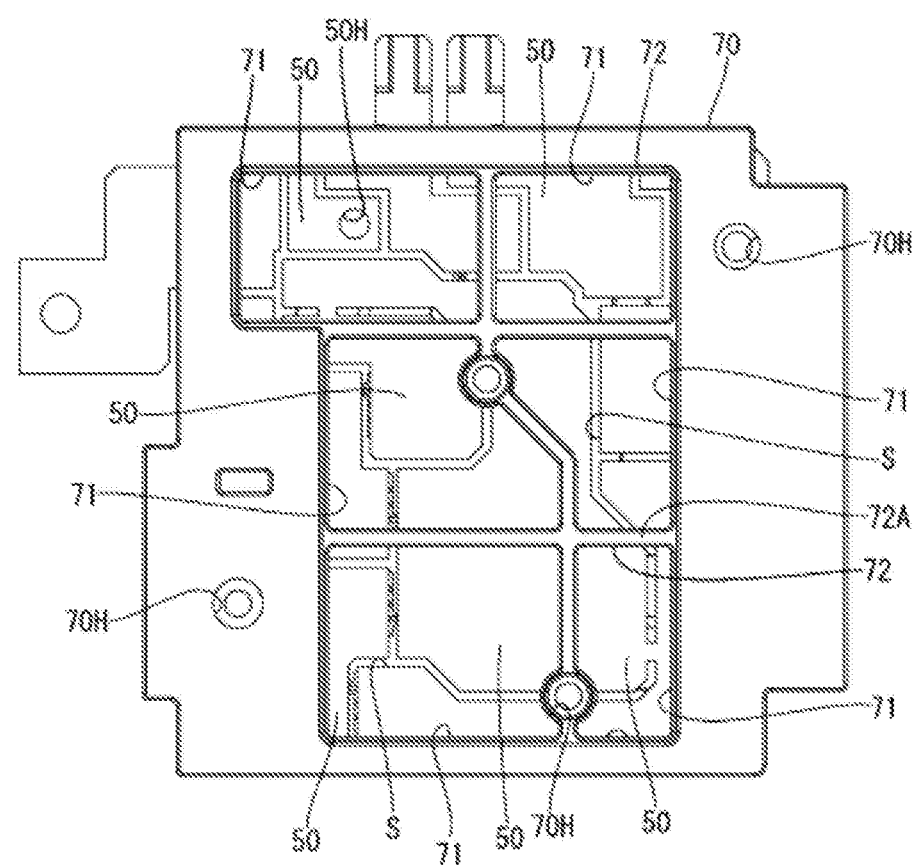
FIG. 4 is a plan view of a circuit structure excluding a heat dissipation plate, an insulating sheet, and an adhesive sheet, taken from the bottom surface thereof.
Figure 5:
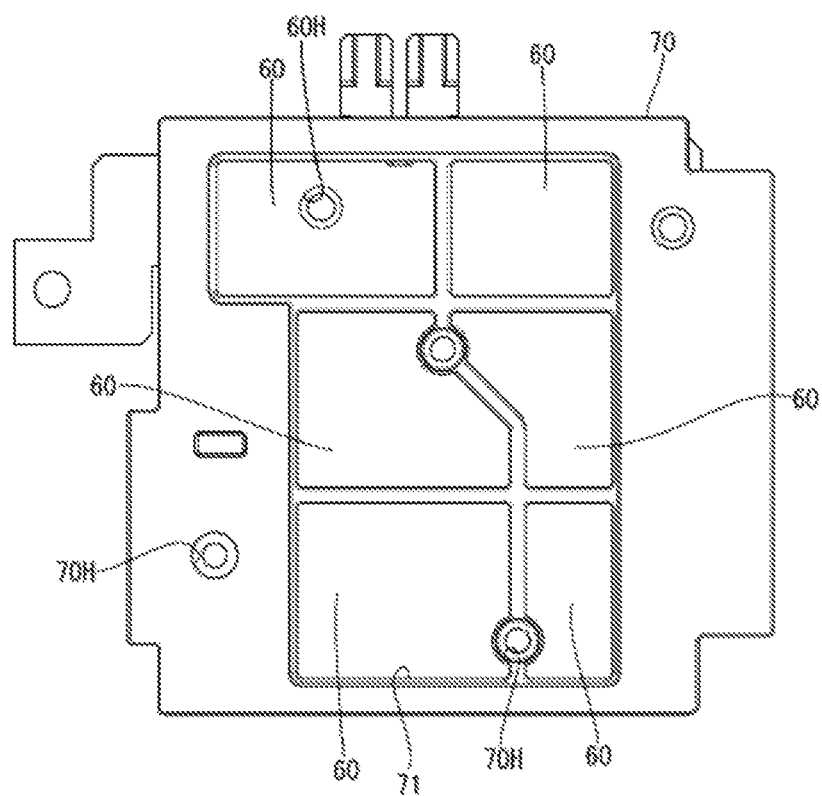
FIG. 5 is a plan view of the circuit structure excluding the heat dissipation plate, taken from the bottom surface thereof.

As shown in FIG. 4 and so forth, the frame plate 70 includes application openings 71 and frame portions 72. The application openings 71 are provided so as to correspond, in plan view, to the positions at which the electronic components that require heat dissipation, such as the MOSFET 30, are disposed. Each frame portion 72 is formed around an application opening 71, and includes a protruding portion 72A protruding to the heat dissipation plate 90 side. As shown in FIG. 3, when the frame plate 70 is fitted to the groove 91 of the heat dissipation plate 90, the protruding portion 72 abuts against the bottom of the groove 91, thus closing the groove 91. Accordingly, the protruding portion 72A restricts movement of the insulating heat-transfer material 80 to another application opening 71 as the temperature of the insulating heat-transfer material 80 increases. The frame plate 70 is an example of the "restricting member".

When the frame plate 70 is fitted to the groove 91 of the heat dissipation plate 90, the protruding portion 72A of the frame plate 70 is formed so as to have a jutting out portion 72B that juts out from an upper surface 90A of the heat dissipation plate 90 by a thickness TH of the insulating heat-transfer material 80, as shown in FIG. 3. The sticking out portion 72B serves as a partition of the insulating heat-transfer material 80 when the insulating heat-transfer material 80 is applied to the inside of the application opening 71 of the frame plate 70, on the upper surface 90A of the heat dissipation plate 90.

Note that the insulating heat-transfer material 80 is constituted by a cold setting adhesive in the present embodiment. The cold setting adhesive 80 is an adhesive that has insulating properties and thermal conductivity (heat transferring properties), and hardens at room temperature. The insulating heat-transfer material is not limited thereto, and may be constituted, for example, by a hot setting adhesive, or may be constituted by a heat dissipating grease with no adhesive properties.

The heat dissipation plate 90 is provided on a surface 50B side of the plurality of bus bars 50 that is opposite to a surface 50A opposing the circuit board 20, via the cold setting adhesive 80. More specifically, the heat dissipation plate 90 is attached to the lower surfaces 50B of the plurality of bus bars 50 via the cold setting adhesive 80 and the insulating sheet 60 (see FIG. 3).

The heat dissipation plate 90 is, for example, a plate-shaped member made of a metal material that has excellent thermal conductivity, such as aluminum or an aluminum alloy, and has the function of dissipating heat generated by the heat-generating electronic components such as the MOSFET 30. Here, the heat dissipation plate 90 is bonded to the lower surface (bottom surface) side of the bus bars 50 by using the cold setting adhesive 80.

Figure 6:
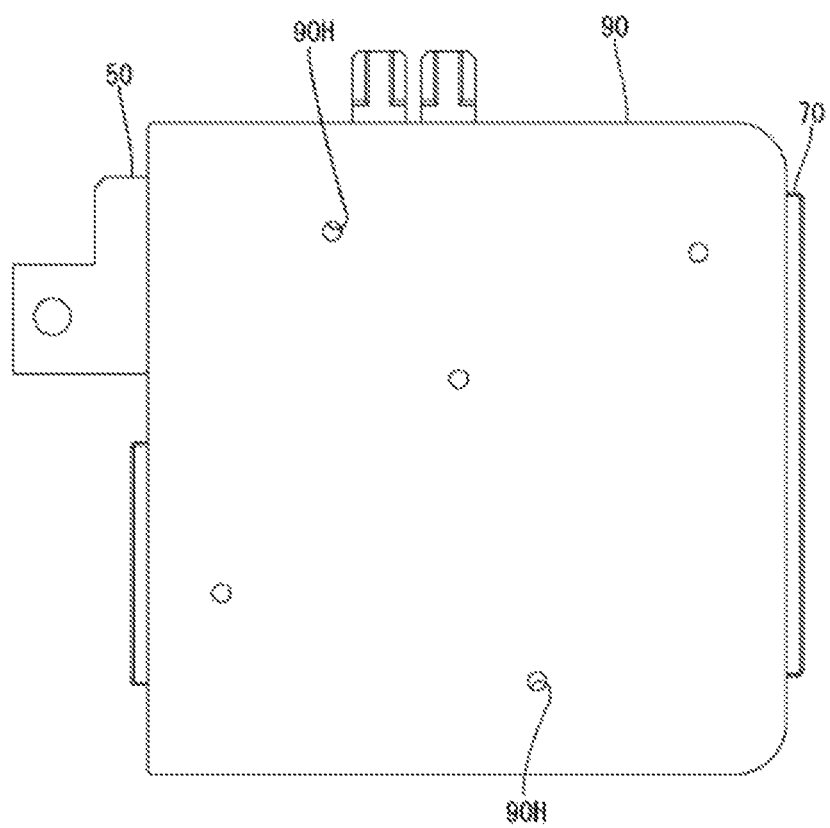
FIG. 6 is a plan view of the circuit structure, taken from the bottom surface thereof.

As shown in FIG. 6, a plurality of attachment threaded holes 90H are formed in the heat dissipation plate 90, and a plurality of attachment holes 20H are formed in the circuit board 20 at the positions corresponding to the plurality of attachment threaded holes 90H (see FIG. 1). At the positions corresponding to the plurality of attachment holes 20H, a plurality of through holes 40H are formed in the adhesive sheet 40, a plurality of through holes 50H (see FIG. 4) are formed in a predetermined bus bar 50, a plurality of through holes 60H are formed in the insulating sheet 60 (see FIG. 5), and a plurality of through holes 70H (see FIGS. 4 and 5) are formed in the frame plate 70. Then, screws (not shown) are fastened from the plurality of attachment holes 20H of the circuit board 20, through the through holes, to the plurality of attachment threaded holes 90H of the heat dissipation plate 90, and thus, the components from the circuit board 20 to the heat dissipation plate 90 are fixed so as to be integrated with each other.

The circuit board 20 is shielded by attaching a metal cover (not shown) to the top of the circuit board 20. Specifically, the electronic components such as the MOSFET 30 on the circuit board 20 are electrostatically shielded by fixing the metal cover to the ground bus bar included in the plurality of bus bars 50.

4. Schematic Manufacturing Process of Electrical Junction Box

Subsequently, an example of the manufacturing process of an electrical junction box 1 according to the present embodiment will be described. First, pressing is performed in a state in which an adhesive sheet 40 that has been cut into a predetermined shape is stacked onto the bottom surface 20B of the circuit board 20 that has a conductive path formed on the surface thereof using a printed wiring technique, and a plurality of bus bars 50 are also arranged in a predetermined pattern. Consequently, the circuit board 20 and the plurality of bus bars 50 are bonded and fixed to each other via the adhesive sheet 40. In this state, a part (the region in which the connection terminals 33 and 34 of the MOSFET 30 are connected, for example) of the upper surface of each of the plurality of bus bars 50 is exposed through a connection opening 21 of the circuit board 20 and a sheet opening 41 of the adhesive sheet 40.

Subsequently, solder is applied to a predetermined position of the circuit board 20 through screen printing. Thereafter, the electronic components such as the MOSFET 30 are placed at predetermined positions, and reflow soldering is performed.

Next, the frame plate 70 is fitted to the groove 91 of the upper surface 90A of the heat dissipation plate 90. Then, the cold setting adhesive 80 is applied to the upper surface 90A of the heat dissipation plate 90 via the application opening 71 of the frame plate 70. Then, the circuit board 20 on which the electronic components and the plurality of bus bars 50 are disposed is stacked thereon via the insulating sheet 60 from above, and the components from the circuit board 20 to the heat dissipation plate 90 are integrated, and screwed together using screws, for example. At this time, the gaps S between the bus bars 50 are covered by the insulating sheet 60, and thus the cold setting adhesive 80 will not enter the gaps S (see FIG. 3). Further, the cold setting adhesive 80 falls within the region of each of the application openings 71 of the frame plate 70. Finally, the circuit board 20 (circuit structure 10) on which the heat dissipation plate 90 is stacked is housed in the case 2, thus forming an electrical junction box 1.

4. Effects Achieved by the Present Embodiment

As described above, the insulating sheet 60 and the frame plate 70 that restrict movement of the cold setting adhesive 80 caused by a temperature increase of the cold setting adhesive 80 are provided between the plurality of bus bars 50 and the heat dissipation plate 90 in the present embodiment. Accordingly, even if the cold setting adhesive 80 softens or expands when the temperature of the cold setting adhesive 80 increases due to an increase in the temperature of the location where the circuit structure 10 is installed, the insulating sheet 60 and the frame plate 70 restrict escape of the cold setting adhesive 80 from directly below the MOSFET (electronic component) 30 to the surroundings thereof between the plurality of bus bars 50 and the heat dissipation plate 90. Consequently, the cold setting adhesive 80 located directly below an electronic component acting as a heat generating element such as the MOSFET 30 will not become insufficient when the temperature of the cold setting adhesive 80 decreases, and the transmission of heat (heat transfer) from the plurality of bus bars 50 to the heat dissipation plate 90 by the cold setting adhesive 80 can be maintained. As a result, it is possible to suppress a reduction in the heat dissipation effect of the heat dissipation plate 90 included in the circuit structure 10 owing to thermal cycles.

The frame plate portion 70 includes the application opening 71 for applying the cold setting adhesive 80, and the frame portion 72 including the protruding portion 72A protruding to the heat dissipation plate side. Further, the protruding portion 72A of the frame portion 72 is embedded in the groove 91 of the heat dissipation plate 90. Accordingly, even if the cold setting adhesive 80 softens or expands when the temperature of the cold setting adhesive 80 increases, it is possible to prevent the cold setting adhesive 80 applied to the inside of a predetermined application opening 71 from escaping, by using the protruding portion 72A, from directly below the MOSFET 30 to the surroundings such as another application opening 71.

As the restricting member, the insulating sheet 60 that covers the gaps S between the plurality of bus bars 50 is further provided between the plurality of bus bars 50 and the frame plate 70. Accordingly, when the temperature of the cold setting adhesive 80 increases, it is possible to further restrict movement of the cold setting adhesive 80 to the gaps S between the plurality of bus bars 50 from below the MOSFET 30 by using the insulating sheet 60. Consequently, it is possible to further suppress a reduction in the heat dissipation effect of the heat dissipation plate 90 owing to thermal cycles.

Since the insulating heat-transfer material is constituted by the cold setting adhesive 80, it is possible to omit the steps required for heat curing that includes increasing the temperature for heating and time for cooling, and further utilize the effect of restricting movement of the insulating heat-transfer material with the insulating sheet 60 and the frame plate 70 serving as the restricting members, when the temperature of the cold setting adhesive 80 increases.

Other Embodiments

The technique disclosed herein is not limited to the embodiment described above by way of the description and the drawings, and includes, for example, various embodiments as follows.

(1) Although the above-described embodiment shows the configuration including the insulating sheet 60 and the frame plate 70 as the restricting member, the present invention is not limited thereto. For example, the insulating sheet 60 may be omitted.

Alternatively, the frame plate 70 may be omitted. That is, the restricting member may be simply constituted by the insulating sheet 60 that is provided between the plurality of bus bars 50 and the heat dissipation member 90, and covers the gaps S between the plurality of bus bars 50. In this case, the groove 91 of the heat dissipation plate 90 is also omitted.

(2) Although the above-described embodiment shows an example in which the cold setting adhesive 80 is used as the insulating heat-transfer material, the present invention is not limited thereto. For example, a hot setting adhesive or a heat transferring grease may be used as the insulating heat-transfer material. Even in the case of using such an insulating heat-transfer material, it is possible, with the restricting member, to restrict movement of the insulating heat-transfer material caused by a temperature increase of the insulating heat-transfer material, thus making it possible to suppress a reduction in the heat dissipation effect of the heat dissipation plate 90 owing to thermal cycles. Note that "movement of the insulating heat-transfer material" includes expansion, displacement, shifting, or the like of the insulating heat-transfer material caused by a temperature increase of the insulating heat-transfer material.

(3) In the above-described embodiment, the insulating sheet 60 may contain an adhesive. In this case, the insulating sheet 60 can be fixed to the plurality of bus bars 50. Accordingly, it is possible to prevent shifting or the like of the insulating sheet 60, and stably hold the insulating sheet 60 between the plurality of bus bars 50 and the heat dissipation plate 90.

(4) The above-described embodiment shows, as a mode of implementation of the electronic component (MOSFET) 30 that is connected to the bus bar 50 and requires heat dissipation, an example in which at least one of the connection terminals of the electronic components 30 are connected to the circuit board 20, and the electronic component 30 is mounted on the top surface side of the circuit board 20. However, the present invention is not limited thereto. For example, it is possible to adopt a configuration in which all of the connection terminals of the electronic components are connected to the bus bars via the connection openings 21 of the circuit board 20, and the electronic components are mounted to the bus bars via the connection openings 21. The technique related to the restricting member disclosed herein can be applied to such electronic components.

The invention claimed is:

1. A circuit structure comprising:
   a circuit board that has a connection opening,
   an electronic component being mounted on a top surface side of the circuit board, a plurality of bus bars being disposed on a bottom surface side thereof, the electronic component including a plurality of connection terminals, and at least one connection terminal of the plurality of connection terminals being connected to a bus bar on the bottom surface side of the circuit board via the connection opening;

a heat dissipation member provided on a side of the plurality of bus bars that is opposite to the side on which the electronic component is connected, via an insulating heat-transfer material that has insulating properties and heat transferring properties; and a restricting member that is provided between the plurality of bus bars and the heat dissipation member, and that restricts movement of the insulating heat-transfer material caused by an increase in the temperature of the insulating heat-transfer material;

wherein the restricting member is constituted by a frame plate that has insulating properties, the restricting member includes an insulating sheet that is provided between the plurality of bus bars and the frame plate, and that covers gaps between the plurality of bus bars, the insulating sheet being configured to restrict movement of the insulating heat-transfer material from directly below the electronic component to the gaps, the frame plate includes:

an application opening that is provided corresponding, in plan view, to a position at which the electronic component is disposed, and that serves to allow application of the insulating heat-transfer material to the electronic component; and a frame portion that is formed around the application opening, and that includes a protruding portion that protrudes to the heat dissipation member side, and the heat dissipation member includes a groove in which the protruding portion of the frame portion is embedded.

2. A circuit structure comprising:

a circuit board that has a connection opening, an electronic component being mounted on a top surface side of the circuit board, a plurality of bus bars being disposed on a bottom surface side thereof, the electronic component including a plurality of connection terminals, and at least one connection terminal of the plurality of connection terminals being connected to a bus bar on the bottom surface side of the circuit board via the connection opening;

a heat dissipation member provided on a side of the plurality of bus bars that is opposite to the side on which the electronic component is connected, via an insulating heat-transfer material that has insulating properties and heat transferring properties; and a restricting member that is provided between the plurality of bus bars and the heat dissipation member, and that restricts movement of the insulating heat-transfer material caused by an increase in the temperature of the insulating heat-transfer material, wherein the restricting member is an insulating sheet that is provided between the plurality of bus bars and the heat dissipation member, and that covers gaps between the plurality of bus bars, the insulating sheet being configured to restrict movement of the insulating heat-transfer material from directly below the electronic component to the gaps.

3. The circuit structure according to claim 1, wherein the insulating sheet contains an adhesive.

4. The circuit structure according to claim 2, wherein the insulating sheet contains an adhesive.

5. The circuit structure according to claim 1, wherein the insulating heat-transfer material is constituted by a cold setting adhesive.

6. The circuit structure according to claim 2, wherein the insulating heat-transfer material is constituted by a cold setting adhesive.

7. The circuit structure according to claim 3, wherein the insulating heat-transfer material is constituted by a cold setting adhesive.

8. An electrical junction box comprising:
the circuit structure according to claim 1, and
a case that houses the circuit structure.

9. An electrical junction box comprising:
the circuit structure according to claim 2, and
a case that houses the circuit structure.

10. An electrical junction box comprising:
the circuit structure according to claim 3, and
a case that houses the circuit structure.

* * * * *